United States Patent
Lee et al.

(10) Patent No.: US 8,362,454 B2
(45) Date of Patent: Jan. 29, 2013

(54) RESISTIVE RANDOM ACCESS MEMORY HAVING METAL OXIDE LAYER WITH OXYGEN VACANCIES AND METHOD FOR FABRICATING THE SAME

(75) Inventors: Hengyuan Lee, Tainan (TW); Pang-Hsu Chen, Hsinchu (TW); Tai-Yuan Wu, Taipei (TW); Ching-Chiun Wang, Miaoli (TW)

(73) Assignee: Industrial Technology Research Institute, Hsinchu (TW)

( * ) Notice: Subject to any disclaimer, the term of this patent is extended or adjusted under 35 U.S.C. 154(b) by 572 days.

(21) Appl. No.: 12/334,203

(22) Filed: Dec. 12, 2008

(65) Prior Publication Data
US 2010/0038791 A1  Feb. 18, 2010

(30) Foreign Application Priority Data
Aug. 12, 2008 (TW) .................. 97130654 A

(51) Int. Cl.
*H01L 27/24* (2006.01)
(52) U.S. Cl. .................. 257/3; 257/E21.008; 438/382
(58) Field of Classification Search ....... 257/3, E21.008, 257/E21.59, E21.647; 438/382, 656
See application file for complete search history.

(56) References Cited

U.S. PATENT DOCUMENTS

| | | | | |
|---|---|---|---|---|
| 6,831,854 B2 * | 12/2004 | Rinerson et al. | ............. | 365/158 |
| 2004/0012047 A1 | 1/2004 | Lin et al. | | |
| 2004/0262663 A1 | 12/2004 | Lin et al. | | |
| 2007/0048990 A1 | 3/2007 | Zhuang et al. | | |
| 2007/0200158 A1 | 8/2007 | Genrikh et al. | | |
| 2007/0215977 A1 | 9/2007 | Lee et al. | | |
| 2007/0228370 A1 | 10/2007 | Lee et al. | | |
| 2007/0257257 A1 | 11/2007 | Cho et al. | | |
| 2007/0269683 A1 | 11/2007 | Chen et al. | | |
| 2007/0290186 A1 | 12/2007 | Bourim et al. | | |
| 2007/0295950 A1 | 12/2007 | Cho et al. | | |
| 2009/0189159 A1 | 7/2009 | Enicks et al. | | |

OTHER PUBLICATIONS

Heng-Yuan Lee et al. "HfO$_2$ Bipolar Resistive Memory Device with Robust Endurance using AlCu as Electrode", pp. 146-147, VLSI-TSA 2008, Apr. 2008, TW.

* cited by examiner

*Primary Examiner* — Thomas L Dickey

(57) ABSTRACT

A resistive random access memory and a method for fabricating the same are provided. The method includes providing a bottom electrode formed on a substrate. A metal oxide layer is formed on the bottom electrode. An oxygen atom gettering layer is formed on the metal oxide layer. A top electrode is formed on the oxygen atom gettering layer. The previous mentioned structure is subjected to a thermal treatment, driving the oxygen atoms of the metal oxide layer to migrate into and react with the oxygen atom gettering layer, thus leaving a plurality of oxygen vacancies of the metal oxide layer.

35 Claims, 9 Drawing Sheets

US 8,362,454 B2

RESISTIVE RANDOM ACCESS MEMORY HAVING METAL OXIDE LAYER WITH OXYGEN VACANCIES AND METHOD FOR FABRICATING THE SAME

CROSS REFERENCE TO RELATED APPLICATIONS

This application is based upon and claims the benefit of priority from the prior Taiwan Patent Application No. 97130654, filed on Aug. 12, 2008, the entire contents of which are incorporated herein by reference.

BACKGROUND OF THE INVENTION

1. Field of the Invention

The invention relates to a memory element, and more particularly to a resistive random access memory element.

2. Description of the Related Art

For IC (integrated circuit) designers, the ideal semiconductor memory includes random accessibility, non-volatile characteristics, increased capacity, increased speed, reduced power consumption, and unlimited reading and writing functions. Resistive random access memory (RRAM) technology has been gradually recognized as having exhibited the aforementioned semiconductor memory advantages.

Please refer to FIG. 1, a conventional single-pole operation resistive random access memory 10 with a single oxide layer is shown. The resistive random access memory 10 includes a Pt bottom electrode 14, a dielectric layer 16 of nickel oxide, and a Pt top electrode 18 sequentially formed on a substrate 12. The structure of the conventional resistive random access memory 10 can be represented as below: Pt/NiO/Pt. The conventional resistive random access memory 10, however, exhibits extremely unstable operating voltage (in particular SET voltage) after repeated and continuous conversion of resistance, resulting in loss of endurance.

U.S. Pat. Publication No. 20070215977 discloses a resistive random access memory 20 with two adjacent oxide layers, as shown in FIG. 2. The resistive random access memory 20 includes a lower electrode 22, a first oxide layer 23, a second oxide layer 24 doped with transition metals (serving as current control layer), and an upper electrode 25 sequentially formed on a substrate 21. In comparison with the conventional single-pole operation resistive random access memory 10, the resistive random access memory 20 has lower on-current. Even so, the resistive random access memory 20 does not improve upon endurance.

Therefore, it is necessary to develop a resistive random access memory with superior endurance and reduced on-current.

BRIEF SUMMARY OF THE INVENTION

An exemplary embodiment of a method for fabricating a resistive random access memory includes: forming a bottom electrode on a substrate; forming a metal oxide layer on the bottom electrode; forming an oxygen atom gettering layer on the metal oxide layer; forming a top electrode on the oxygen atom gettering layer; and subjecting the metal oxide layer and the oxygen atom gettering layer to a thermal treatment, driving the oxygen atoms of the metal oxide layer to migrate into and react with the oxygen atom gettering layer, resulting in a plurality of oxygen vacancies within the metal oxide layer.

Another exemplary embodiment of a resistive random access memory includes: a bottom electrode disposed on a substrate; a metal oxide layer with oxygen vacancies disposed on the bottom electrode; an oxygen atom gettering layer, oxidized by migrated oxygen atoms of the metal oxide layer, disposed on the metal oxide layer; and a top electrode formed on the oxygen atom gettering layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The method for fabricating a resistive random access memory of the invention includes subjecting a metal oxide layer and an oxygen atom gettering layer (adjacent to the oxide layer) to a thermal treatment, and forcing the oxygen atoms of oxide layer to migrate into the oxygen atom gettering layer to leave oxygen vacancies within the oxide layer. Since the oxygen vacancies of the resistive random access memory can optionally capture or release electric charges, the resistive random access memory of the invention exhibits stable binary resistance switching characteristics.

The following description is of the best-contemplated mode of carrying out the invention. This description is made for the purpose of illustrating the general principles of the invention and should not be taken in a limiting sense. The scope of the invention is best determined by reference to the appended claims.

Figure 1:
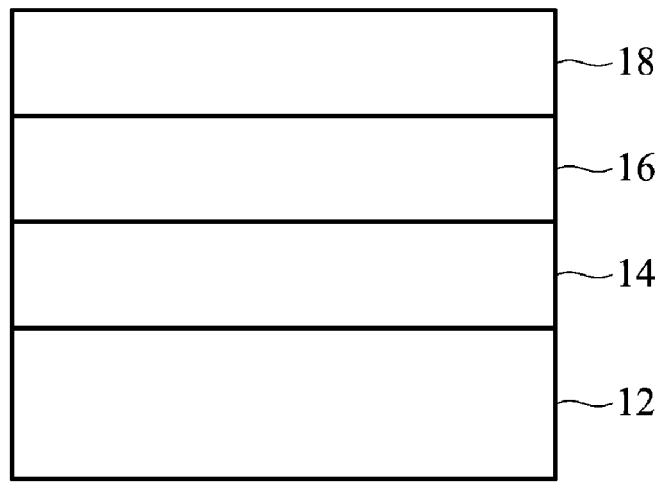
FIG. 1 is a cross section of a conventional resistive random access memory.
Figure 2:
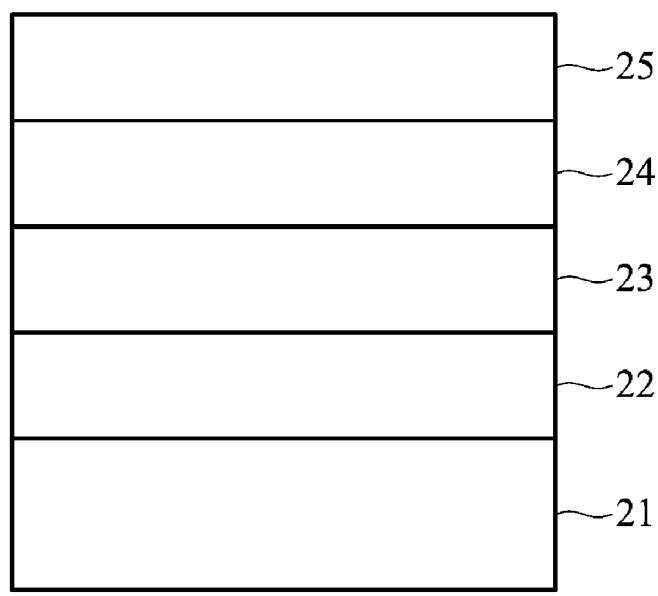
FIG. 2 is a cross section of a conventional resistive random access memory with two adjacent oxide layers.
Figure 3A:
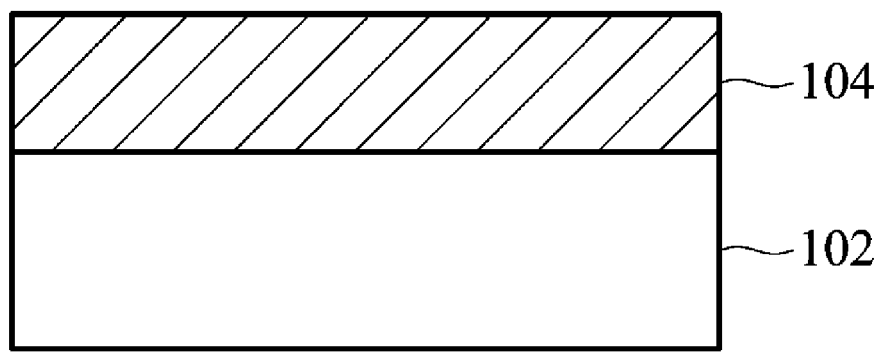
FIGS. 3a to 3e are cross sections of a method for fabricating a resistive random access memory according to an embodiment of the invention.

First, referring to FIG. 3a, a substrate 102 with a bottom electrode 104 formed thereon is provided. Particularly, the substrate 102 can be a substrate employed in a semiconductor process, such as silicon substrate. The substrate 102 can be a substrate including a complementary metal oxide semiconductor (CMOS) circuit, isolation structure, diode, or capacitor. The accompanying drawings show the substrate 100 in a plain rectangle in order to simplify the illustration. Further, the bottom electrode 104 can be electrically connected to a drain electrode of a transistor (not shown). The bottom electrode 104 can further include an oxygen barrier layer formed thereon. Suitable material for the bottom electrode 104 can be TaN, TiN, TiAlN, TiW, Pt, W, Ru, or combinations thereof, and thickness of the bottom electrode can be between 5-500 nm.

Figure 3B:
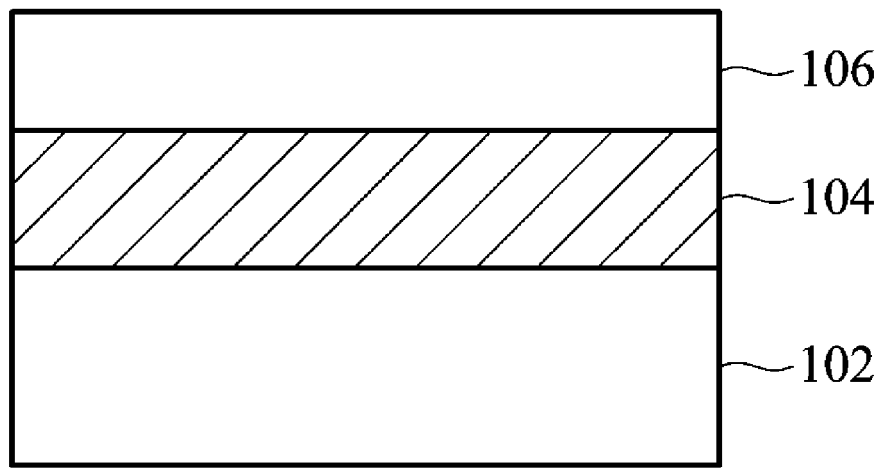

Next, please refer to FIG. 3b, wherein a metal oxide layer 106 is formed on the bottom electrode 104 and directly contacts to the bottom electrode 104. Herein, the metal oxide layer can consist of a binary oxide, such as binary metal oxide with oxides containing Al, Hf, Ti, Nb, Ta, La, or Zr. It should be noted that since the oxide layer must be formed directly on the bottom electrode and a subsequent oxygen atom gettering layer must be formed on the oxide layer, the binary oxide layer can achieve the expected characteristics of a resistive random access memory (RRAM). Therefore, a ternary oxide layer is not required to be used as the oxide layer of the invention, resulting in reduction of process complexity. The method for forming the metal oxide layer is unlimited. The thickness of the metal oxide layer 106 can be between 1-100 nm.

Figure 3C:
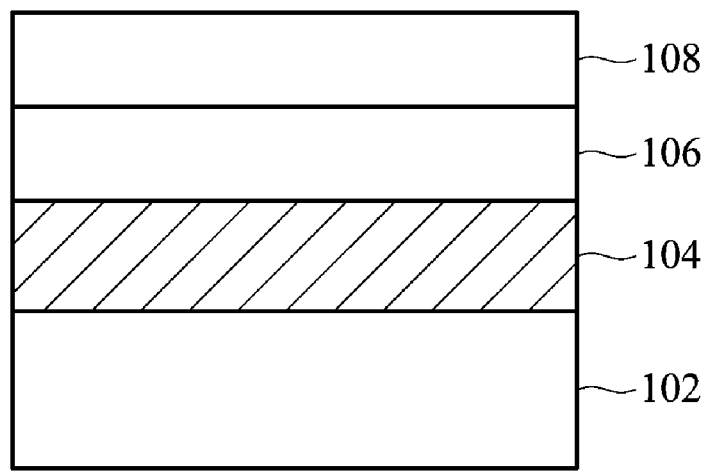

Next, please refer to FIG. 3c, wherein an oxygen atom gettering layer 108 is formed on the metal oxide layer 106 and directly contacts to the metal oxide layer 106. The thickness of the oxygen atom gettering layer can be between 1-50 nm. In an embodiment of the invention, the oxygen atom gettering layer can be metal, such as Mg, Al, Zn, Ti, Hf, La, Ta, Zr, Cu, laminations thereof, or combinations thereof (for example AlCu). Further, according to another embodiment of the invention, the oxygen atom gettering layer 108 includes partially oxidized metallic oxide or a mixture of metal and metallic oxide. The oxygen atom gettering layer 108 can include partially oxidized metallic oxides containing Mg, Al, Zn, Ti, Hf, La, Ta, Zr, Cu, or combinations thereof. For example, the oxygen atom gettering layer can include TiO, TaO, or AlO. It should be noted that the oxygen atom gettering layer must include materials which have lower oxidation chemical formation energy than that of the metal oxide layer 106. As a result, after a subsequent thermal treatment, the oxygen atoms of the metal oxide layer 106 would migrate into and react with the oxygen atom gettering layer 108.

Figure 3D:
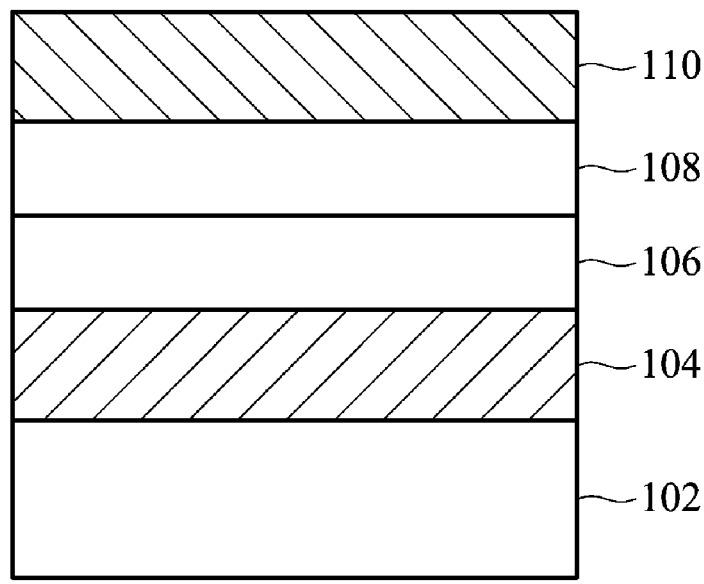

Next, please refer to FIG. 3d, wherein a top electrode 110 is formed on the oxygen atom gettering layer 108. The top electrode includes TaN, TiN, TiAlN, TiW, Pt, W, Ru, or combinations thereof.

Figure 3E:
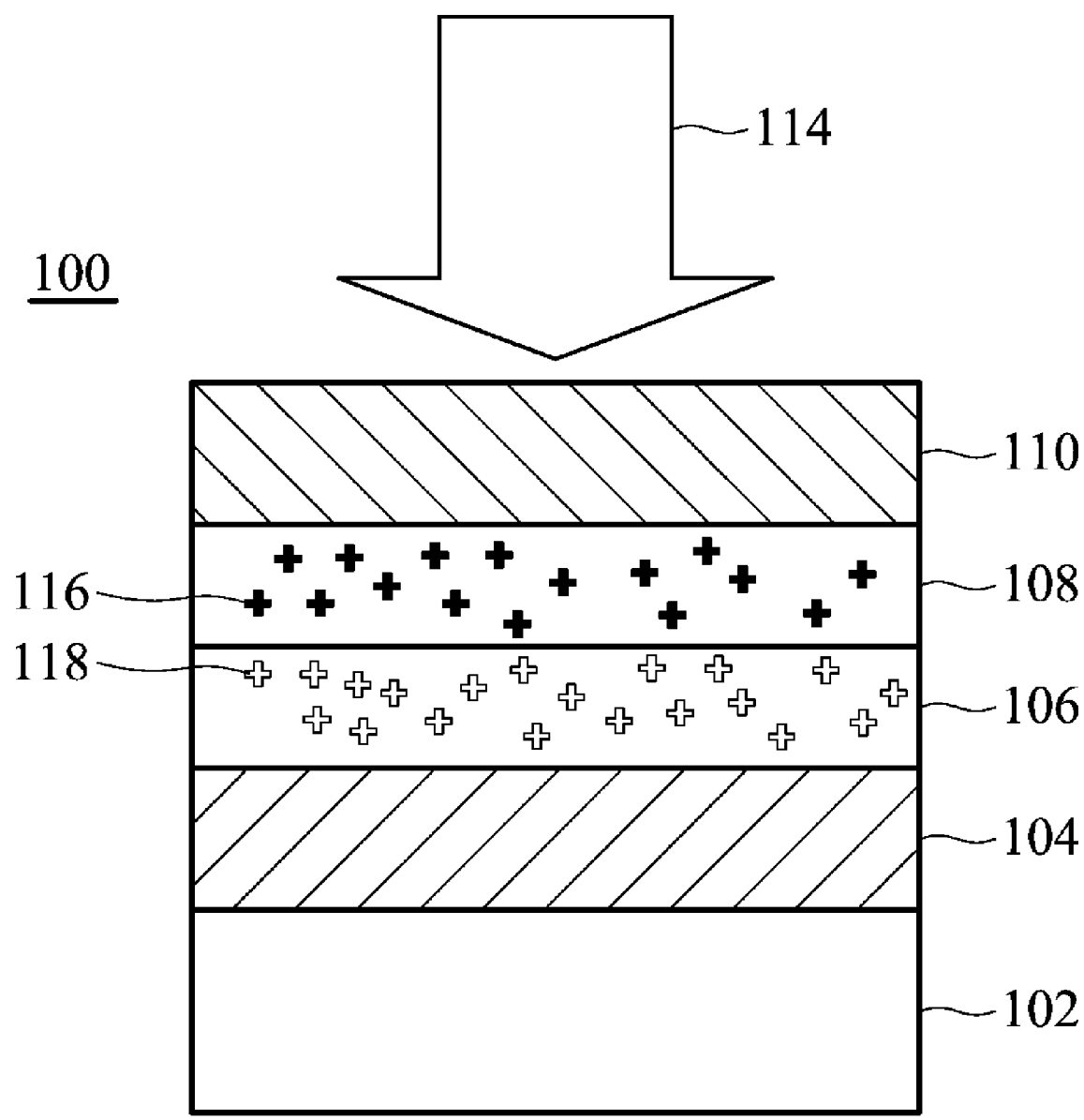

Finally, please refer to FIG. 3e, wherein the structure shown in FIG. 3d (the metal oxide layer 106 and the oxygen atom gettering layer 108) is subjected to a thermal treatment 114, thereby driving the oxygen atoms 116 of the metal oxide layer to migrate into and react with the oxygen atom gettering layer, resulting in a plurality of oxygen vacancies 118 within the metal oxide layer. Thus, completing the process for forming a resistive random access memory. The thermal treatment can be an annealing treatment, a microwave heating treatment, or electro-migration of oxygen atoms and the temperature of the thermal treatment can be between 200-800° C. When the thermal treatment is an annealing treatment, the atmosphere for annealing can be gas or N2. A key aspect for the resistive random access memory of the invention is that the oxygen atom gettering layer must have a higher tendency to react with oxygen than that of the contained metal of the metal oxide layer, so that the oxygen atom gettering layer 108 would be oxidized after performing the thermal treatment and a great amount of oxygen vacancies would be produced in the original metal oxide layer 106.

Since the oxygen vacancies of the resistive random access memory can optionally capture or release electric charges, the resistive random access memory of the invention exhibits stable binary resistance switching characteristics.

Figure 4:
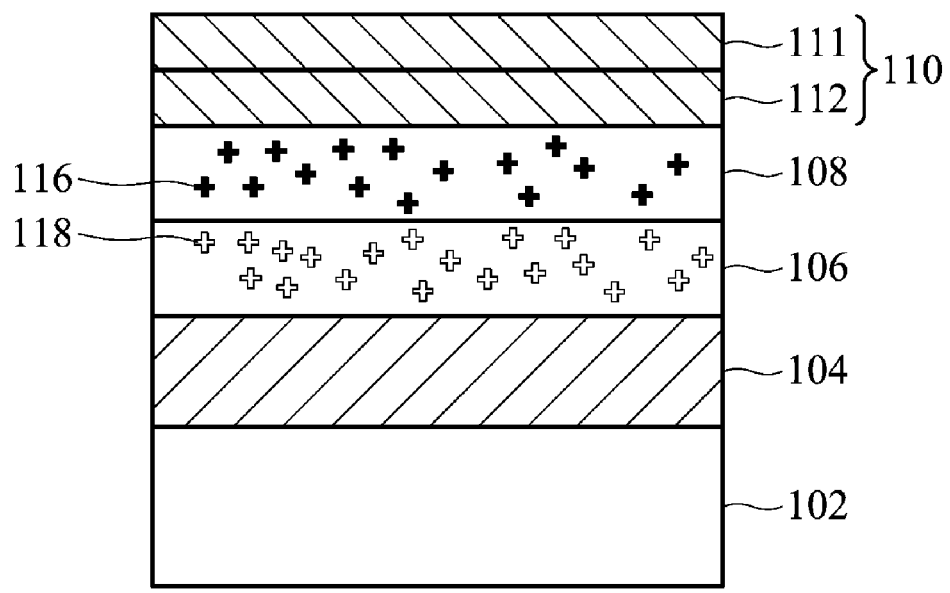
FIG. 4 is a cross section of a resistive random access memory having a top composite electrode according to another embodiment of the invention.

Please refer to FIG. 4, in embodiments of the invention, the top electrode can be a composite electrode including at least two metal layers such as two metal layer (first top electrode sub-layer 111 and second top electrode sub-layer 112 as shown in FIG. 4), wherein the at least two metal layers are made of different materials and respectively include TaN, TiN, TiAlN, TiW, Pt, W, Ru, or combinations thereof. The composite top electrode can prevent oxide atoms from further diffusing thereinto.

Figure 5:
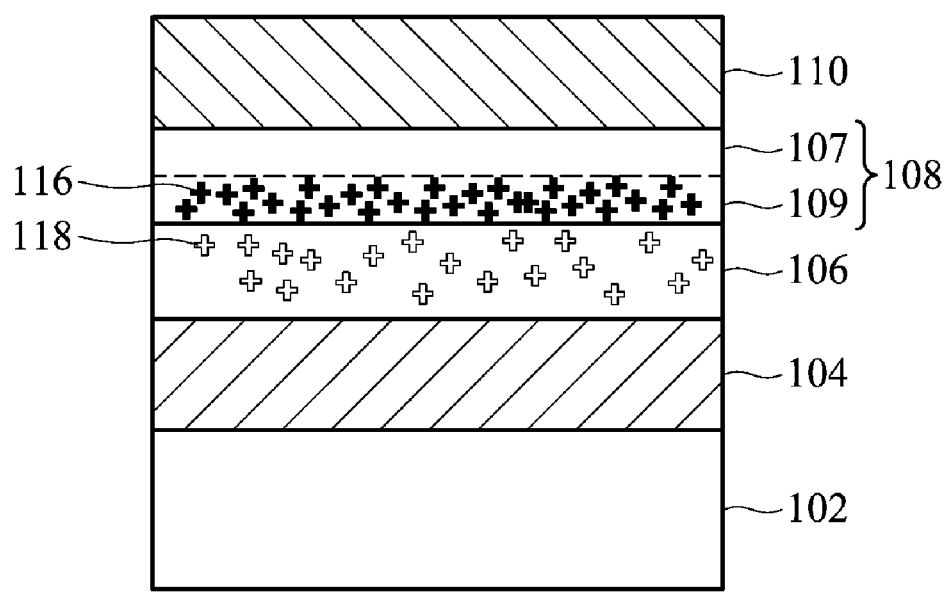
FIG. 5 is a cross section of a resistive random access memory with an oxygen atom gettering layer having a non-oxidized sub-layer according to still another embodiment of the invention.

According to another embodiment of the invention, the oxygen atom gettering layer may not be completely oxidized by migrated oxygen atoms and can be defined as a first sub-layer 107 directly contacted the top electrode 110 and a second sub-layer 109 directly contacted the metal oxide layer 106, as shown in FIG. 5. The first sub-layer 107 is not oxidized by migrated oxygen atoms (i.e. the first sub-layer 107 is still made of metal) and the second sub-layer 109 is oxidized by migrated oxygen atoms (i.e. the second sub-layer 109 is made of oxidized metal). For example, an element has the structure "TiN/Ti/HfO$_2$/TiN" before annealing. When the thickness of Ti layer is not less than 30 nm, the oxygen atoms are incapable of completely diffusing among all Ti layer and the element would have the structure "TiN/Ti/TiOx/HfO$_2$/TiN" after annealing.

Figure 6:
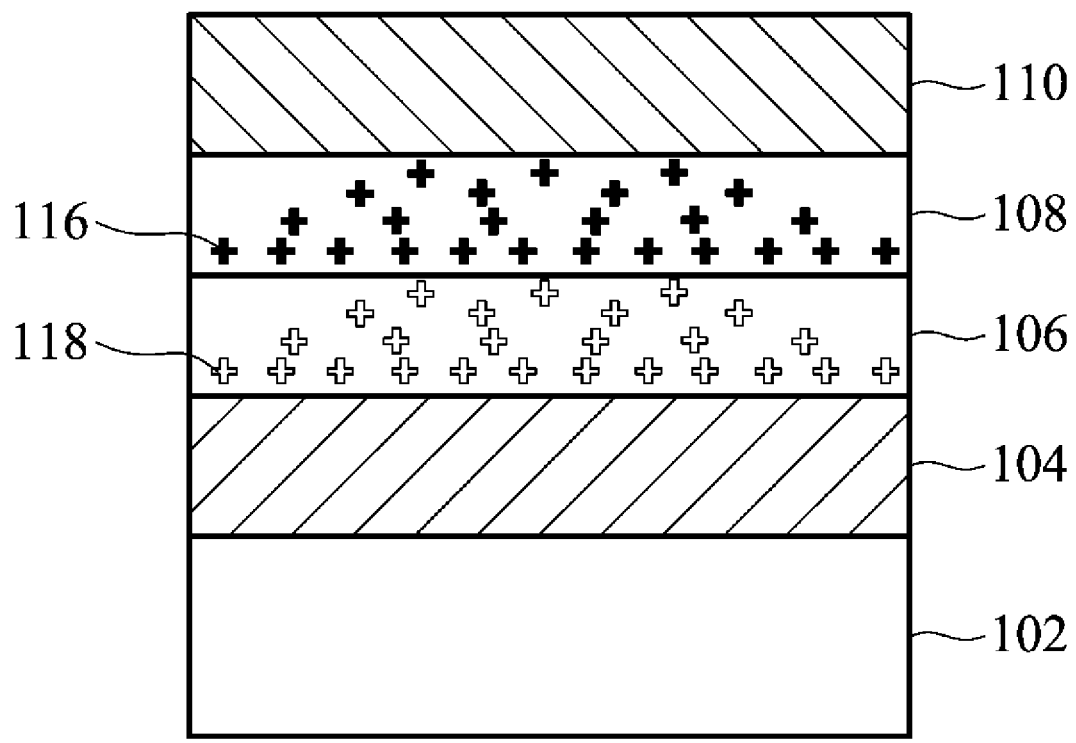
FIG. 6 is a cross section of a resistive random access memory with gradient distribution according to yet another embodiment of the invention.

In still another embodiment of the invention, the oxidized oxygen atom gettering layer 108 can have a gradient distribution of migrated oxygen atoms 116 and the metal oxide layer 106 can have a gradient distribution of oxygen vacancies 118, when the oxygen atom gettering layer 108 has a specific thickness which less than 30 nm, as shown in FIG. 6. Particularly, the gradient direction of the oxidized oxygen atom gettering layer is the same as that of the metal oxide layer.

The following examples are intended to illustrate the invention more fully without limiting its scope, since numerous modifications and variations will be apparent to those skilled in this art.

Example 1

A silicon substrate was provided. A TiN layer with a thickness of 50 nm serving as bottom electrode was formed on the substrate. Next, an HfO layer with a thickness of 20 nm was formed on the bottom electrode, serving as a metal oxide layer. Next, a Ti layer with a thickness of 10 nm was formed on the HfO layer. Next, a TiN layer with a thickness of 50 nm was formed on the Ti layer. Finally, the above structure was subjected to an annealing treatment, thereby forcing the oxygen atoms of the HfO to migrate into the Ti to form TiO. Thus, obtaining a RRAM element A.

Figure 7:
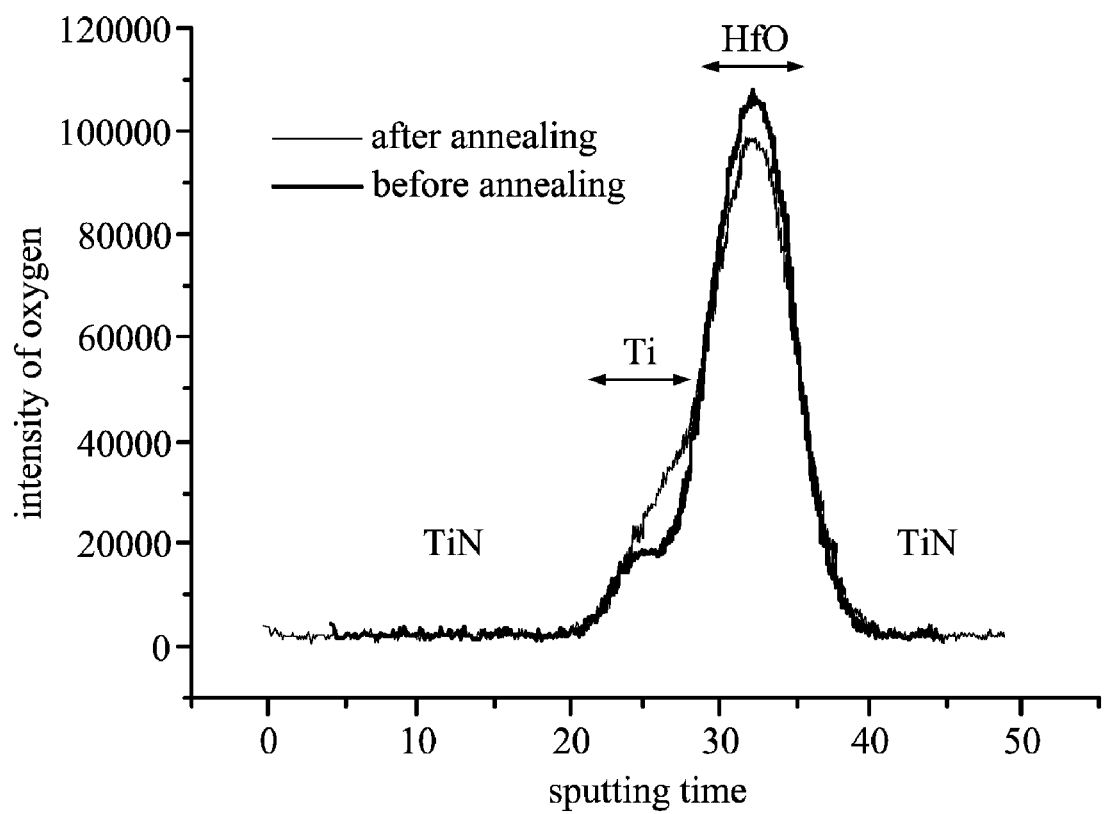
FIG. 7 is a graph plotting intensity of oxygen of each layer of the RRAM element A as disclosed in Example 1 before and after annealing.

The content of the oxygen atoms of the aforementioned structure was measured by an Auger Electron Spectroscopy (AES) before and after annealing, and the results are shown in FIG. 7. The content of the oxygen atoms of the HfO layer was reduced and that of the Ti layer was increased after annealing. Further, the content of the oxygen atoms of the TiN layer was almost the same before and after annealing. Therefore, a great amount of oxygen atoms migrated from the HfO layer into the Ti layer, resulting in production of a great amount of oxygen vacancies.

Figure 8:
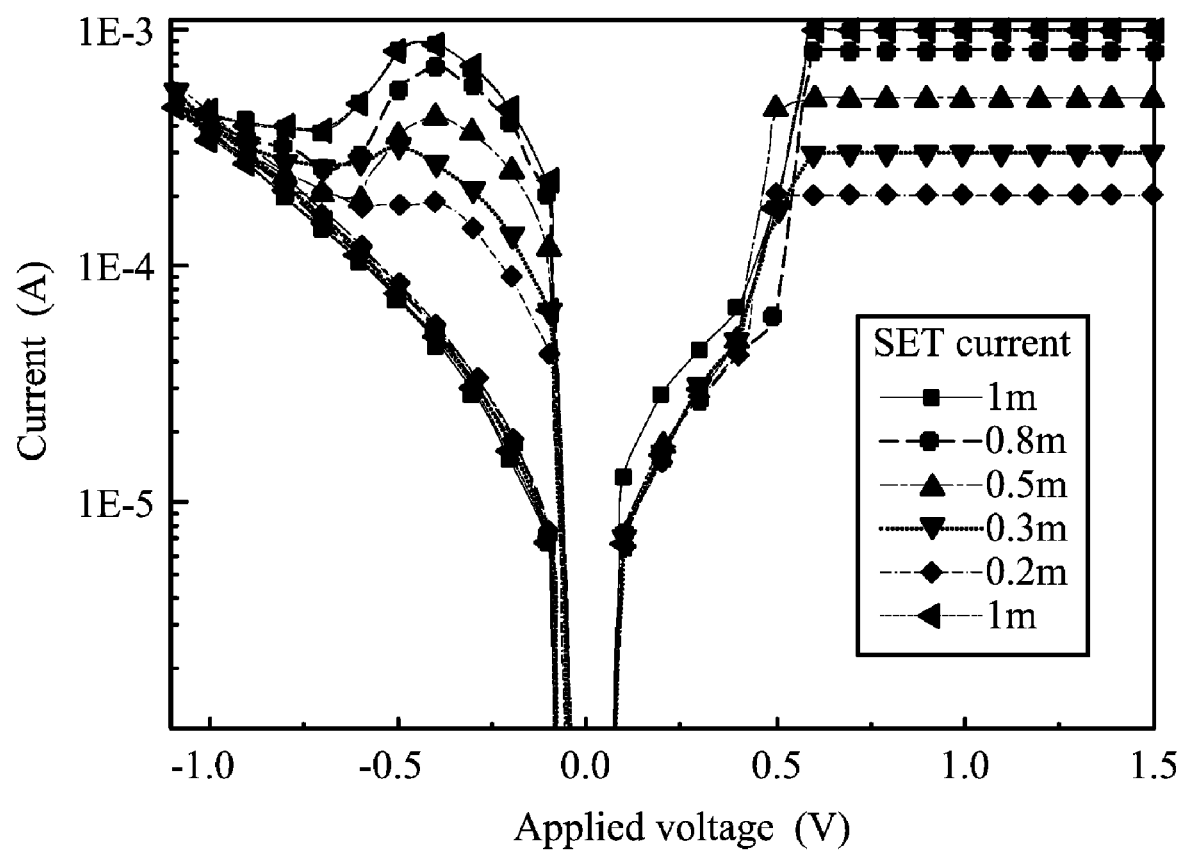
FIG. 8 is a graph plotting current against voltage of the RRAM element A as disclosed in Example 1.
Figure 9:
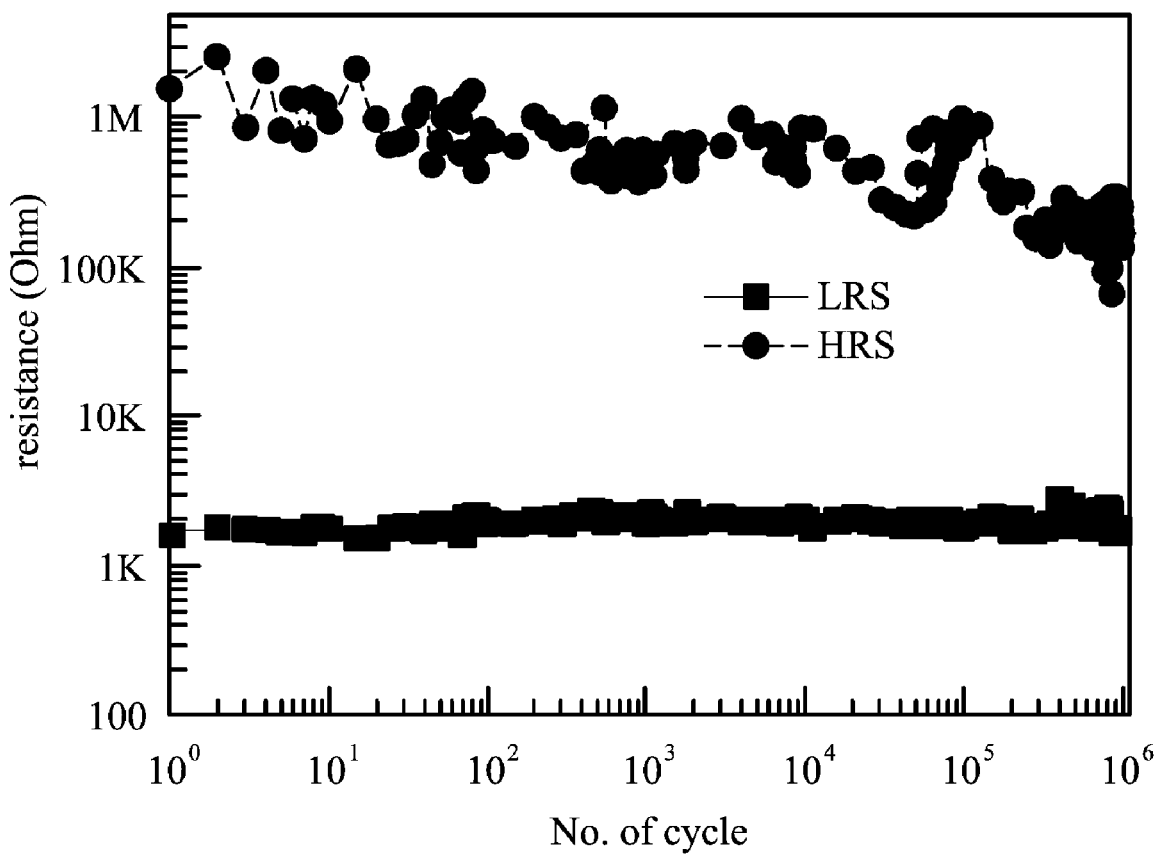
FIG. 9 is a graph plotting a resistance against read/write cycles of the RRAM element A as disclosed in Example 1.

FIG. 8 is a graph showing the resistance switching property of the RRAM element A. The endurance test of 105 switching cycles is shown in FIG. 9. Accordingly, the resistive random access memory of the invention exhibits characteristics of superior stability and endurance.

Example 2

A silicon substrate was provided. A TiN layer with a thickness of 50 nm serving as a bottom electrode was formed on the substrate. Next, an HfO layer with a thickness of 20 nm was formed on the bottom electrode, serving as a metal oxide layer. Next, an Al layer with a thickness of 10 nm was formed on the HfO layer. Next, a TiN layer with a thickness of 50 nm was formed on the Al layer. Finally, the above structure was subjected to an annealing treatment, thereby forcing the oxygen atoms of the HfO to migrate into the Al to form the AlO layer. Thus, obtaining a RRAM element B.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive random access memory, comprises:
a bottom electrode disposed on a substrate;
a metal oxide layer with oxygen vacancies disposed on the bottom electrode and directly contacted to the bottom electrode;
an oxygen atom gettering layer, oxidized by migrated oxygen atoms of the metal oxide layer, disposed on the metal oxide layer; and
a top electrode formed on the oxygen atom gettering layer;
wherein the oxygen atom gettering layer comprises a first sub-layer directly contacted the top electrode and a second sub-layer directly contacted the metal oxide layer, wherein the first sub-layer is not oxidized by migrated oxygen atoms and the second sub-layer is oxidized by migrated oxygen atoms.

2. The resistive random access memory as claimed in claim 1, wherein the bottom electrode comprises an oxygen barrier layer.

3. The resistive random access memory as claimed in claim 1, wherein the bottom electrode comprises TaN, TiN, TiAlN, TiW, Pt, W, Ru, or combinations thereof.

4. The resistive random access memory as claimed in claim 1, wherein the thickness of the bottom electrode is between 5-500 nm.

5. The resistive random access memory as claimed in claim 1, wherein the metal oxide layer with oxygen vacancies comprises a binary oxide layer with oxygen vacancies.

6. The resistive random access memory as claimed in claim 1, wherein the metal oxide layer with oxygen vacancies comprises oxides containing Al, Hf, Ti, Nb, Ta, La, or Zr.

7. The resistive random access memory as claimed in claim 1, wherein the thickness of the metal oxide layer with oxygen vacancies is between 1-100 nm.

8. The resistive random access memory as claimed in claim 1, wherein the oxygen atom gettering layer comprises Mg, Al, Zn, Ti, Hf, La, Ta, Zr, Cu, laminations thereof, or combinations thereof.

9. The resistive random access memory as claimed in claim 1, wherein the top electrode comprises TaN, TiN, TiAlN, TiW, Pt, W, Ru, or combinations thereof.

10. The resistive random access memory as claimed in claim 1, wherein the thickness of the top electrode is between 5-500 nm.

11. The resistive random access memory as claimed in claim 1, wherein the top electrode is a composite electrode comprising at least two metal layers, wherein the at least two metal layers are made of different materials.

12. The resistive random access memory as claimed in claim 11, wherein the at least two metal layers respectively comprises TaN, TiN, TiAlN, TiW, Pt, W, Ru, or combinations thereof.

13. A resistive random access memory, comprising:
a bottom electrode disposed on a substrate;
a metal oxide layer with oxygen vacancies disposed on the bottom electrode and directly contacted to the bottom electrode;
an oxygen atom gettering layer, oxidized by migrated oxygen atoms of the metal oxide layer, disposed on the metal oxide layer; and
a top electrode formed on the oxygen atom gettering layer;
wherein the oxidized oxygen atom gettering layer has a gradient distribution of migrated oxygen atoms.

14. The resistive random access memory as claimed in claim 13, wherein the metal oxide layer has a gradient distribution of oxygen vacancies.

15. The resistive random access memory as claimed in claim 13, wherein the gradient direction of the oxidized oxygen atom gettering layer is the same as that of the metal oxide layer.

16. A method for fabricating a resistive random access memory, comprising:
forming a bottom electrode on a substrate;
forming a metal oxide layer on the bottom electrode;
forming an oxygen atom gettering layer on the metal oxide layer;
forming a top electrode on the oxygen atom gettering layer; and
subjecting the metal oxide layer and the oxygen atom gettering layer to a thermal treatment, driving the oxygen atoms of the metal oxide layer to migrate into and react with the oxygen atom gettering layer, resulting in a plurality of oxygen vacancies within the metal oxide layer.

17. The method as claimed in claim 16, wherein the bottom electrode comprises an oxygen barrier layer.

18. The method as claimed in claim 16, wherein the bottom electrode comprises TaN, TiN, TiAlN, TiW, Pt, W, Ru, or combinations thereof.

19. The method as claimed in claim 16, wherein the thickness of the bottom electrode is between 5-500 nm.

20. The method as claimed in claim 16, wherein the metal oxide layer comprises a binary oxide.

21. The method as claimed in claim 16, wherein the metal oxide layer comprises oxides containing Al, Hf, Ti, Nb, Ta, La, or Zr.

22. The method as claimed in claim 16, wherein the thickness of the metal oxide layer is between 1-100 nm.

23. The method as claimed in claim 16, wherein the thickness of the oxygen atom gettering layer is between 1-50 nm.

24. The method as claimed in claim 16, wherein the oxygen atom gettering layer comprises metal.

25. The method as claimed in claim 24, wherein the oxygen atom gettering layer comprises Mg, Al, Zn, Ti, Hf, La, Ta, Zr, Cu, laminations thereof, or combinations thereof.

26. The method as claimed in claim 16, wherein the oxygen atom gettering layer comprises partially oxidized metallic oxide.

27. The method as claimed in claim 26, wherein the oxygen atom gettering layer comprises partially oxidized metallic oxides containing Mg, Al, Zn, Ti, Hf, La, Ta, Zr, Cu, or combinations thereof.

28. The method as claimed in claim 26, wherein the oxygen atom gettering layer comprises TiO, TaO, or AlO.

29. The method as claimed in claim 16, wherein the top electrode comprises TaN, TiN, TiAlN, TiW, Pt, W, Ru, or combinations thereof.

30. The method as claimed in claim 16, wherein the thickness of the top electrode is between 5-500 nm.

31. The method as claimed in claim 16, wherein the thermal treatment comprises an annealing treatment.

32. The method as claimed in claim 31, wherein the temperature of the annealing treatment is between 200-800° C.

33. The method as claimed in claim 16, wherein the thermal treatment comprises a microwave heating treatment.

34. The method as claimed in claim 33, wherein the temperature of the microwave heating treatment is between 200-800° C.

35. The method as claimed in claim 16, wherein the thermal treatment comprises electro-migration of oxygen atoms.

* * * * *